United States Patent
Zhang et al.

(10) Patent No.: US 9,734,129 B2
(45) Date of Patent: Aug. 15, 2017

(54) LOW COMPLEXITY PARTIAL PARALLEL ARCHITECTURES FOR FOURIER TRANSFORM AND INVERSE FOURIER TRANSFORM OVER SUBFIELDS OF A FINITE FIELD

(71) Applicant: SANDISK ENTERPRISE IP LLC, Dallas, TX (US)

(72) Inventors: Xinmiao Zhang, Seattle, WA (US); Ying Yu Tai, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 268 days.

(21) Appl. No.: 14/258,679

(22) Filed: Apr. 22, 2014

(65) Prior Publication Data

US 2015/0301985 A1 Oct. 22, 2015

(51) Int. Cl.
*G06F 17/14* (2006.01)
*H03M 13/00* (2006.01)
*H03M 13/11* (2006.01)
*H03M 13/15* (2006.01)

(52) U.S. Cl.
CPC ........ *G06F 17/141* (2013.01); *H03M 13/158* (2013.01); *H03M 13/6561* (2013.01); *H03M 13/1171* (2013.01); *H03M 13/152* (2013.01); *H03M 13/1515* (2013.01); *H03M 13/1545* (2013.01)

(58) Field of Classification Search
None
See application file for complete search history.

(56) References Cited

U.S. PATENT DOCUMENTS 3,878,542 A * 4/1975 Myer ................................. 365/1
4,335,398 A * 6/1982 Yamada ............... H04N 1/6025
358/515

(Continued)

OTHER PUBLICATIONS

Notice of Allowance and Fee(s) Due mailed Dec. 31, 2015 in U.S. Appl. No. 14/316,128, 12 pages.

(Continued)

*Primary Examiner* — David H Malzahn
(74) *Attorney, Agent, or Firm* — Toler Law Group, PC (57) ABSTRACT

Low complexity partial parallel architectures for performing a Fourier transform and an inverse Fourier transform over subfields of a finite field are described. For example, circuits to perform the Fourier transforms and the inverse Fourier transform as described herein may have architectures that have simplified multipliers and/or computational units as compared to traditional Fourier transform circuits and traditional inverse Fourier transform circuits that have partial parallel designs. In a particular embodiment, a method includes, in a data storage device including a controller and a non-volatile memory, the controller includes an inverse Fourier transform circuit having a first number of inputs coupled to multipliers, receiving elements of an input vector and providing the elements to the multipliers. The multipliers are configured to perform calculations associated with an inverse Fourier transform operation. The first number is less than a number of inverse Fourier transform results corresponding to the inverse Fourier transform operation.

31 Claims, 5 Drawing Sheets

(56) References Cited

U.S. PATENT DOCUMENTS

| | | | | |
|---|---|---|---|---|
| 4,835,688 | A | * | 5/1989 | Kimura ................ G06T 11/008 345/424 |
| 6,308,295 | B1 | * | 10/2001 | Sridharan ......... H03M 13/1515 707/999.101 |
| 8,014,361 | B2 | | 9/2011 | Ozluturk |
| 8,281,213 | B1 | | 10/2012 | Matache et al. |
| 8,286,049 | B1 | | 10/2012 | McFarland et al. |
| 2007/0067695 | A1 | | 3/2007 | Griesser et al. |
| 2008/0025424 | A1 | | 1/2008 | Yang et al. |
| 2010/0100790 | A1 | * | 4/2010 | Sutskover ............ H03M 13/116 714/752 |
| 2011/0252286 | A1 | | 10/2011 | Li et al. |
| 2012/0110418 | A1 | | 5/2012 | Ma |
| 2012/0257895 | A1 | | 10/2012 | Djordjevic et al. |
| 2013/0173988 | A1 | | 7/2013 | Chen et al. |
| 2014/0006850 | A1 | | 1/2014 | Aliev et al. |
| 2014/0040532 | A1 | * | 2/2014 | Watanabe ........... G06F 13/1668 711/103 |
| 2015/0301985 | A1 | * | 10/2015 | Zhang .................. G06F 17/141 708/403 |
| 2015/0381204 | A1 | * | 12/2015 | Zhang .................. H03M 13/116 714/773 |
| 2015/0381205 | A1 | * | 12/2015 | Zhang .................. H03M 13/116 714/773 |

OTHER PUBLICATIONS

Ex-Parte Quayle Action mailed Feb. 16, 2016 in U.S. Appl. No. 14/316,117, 5 pages.

Li, et al., "Efficient Encoding of Quasi-Cyclic Low-Density Parity-Check Codes", IEEE Transactions on Communications, vol. 54, Issue 1, Jan. 2006, pp. 71-81.

Huang, Q. et al. "A Low-Complexity Encoding of Quasi-Cyclic Codes Based on Galois Fourier Transform," Cornell University Library, arXiv.org > cs > arXiv:1301.3220v1, submitted Jan. 15, 2013, 8 pages.

Zhang, Xinmiao et al. "High-Speed Multi-Block-Row Layered Decoder for Low Density Parity Check (LDPC) Codes," U.S. Appl. No. 14/257,800, filed Apr. 21, 2014, 41 pages.

Zhang, Xinmiao "Interleaved Layered Decoder for Low-Density Parity Check Codes," U.S. Appl. No. 14/258,843, filed Apr. 22, 2014, 34 pages.

Zhang, Xinmiao "Modified Trellis-Based Min-Max Decoder for Non-Binary Low-Density Parity-Check Error-Correcting Codes," U.S. Appl. No. 14/272,621, filed May 8, 2014, 33 pages.

Zhang, Xinmiao et al. "Encoder with Transform Architecture for LDPC Codes Over Subfields Using Message Mapping," U.S. Appl. No. 14/316,117, filed Jun. 26, 2014, 38 pages.

Zhang, Xinmiao et al. "Encoder for Quasi-Cyclic Low-Density Parity-Check Codes Over Subfields Using Fourier Transform," U.S. Appl. No. 14/316,128, filed Jun. 26, 2014, 36 pages.

Huang, Q. et al. "Low-Complexity Encoding of Quasi-Cyclic Codes Based on Galois Fourier Transform," IEEE Transactions on Communications, vol. 62, Issue 6, Jun. 2014, 10 pages.

Tarable, Alberto et al. "Mapping Interleaving Laws to Parallel Turbo and LDPC Decoder Architectures," IEEE Transactions on Information Theory, vol. 50, No. 9, Sep. 2004, pp. 2002-2009.

Hocevar, Dale E. "A Reduced Complexity Decoder Architecture Via Layered Decoding of LDPC Codes," IEEE Workshop on Signal Processing Systems, Oct. 2004, pp. 107-112.

Neeb, Christian et al. "Network-on-Chip-Centric Approach to Interleaving in High Throughput Channel Decoders," IEEE International Symposium on Circuits and Systems, vol. 2, May 2005, pp. 1766-1769.

Gunnam, Kiran et al. "Multi-Rate Layered Decoder Architecture for Block LDPC Codes of the IEEE 802.11n Wireless Standard," IEEE International Symposium on Circuits and Systems, May 2007, pp. 1645-1648.

Darabiha, Ahmad et al. "Power Reduction Techniques for LDPC Decoders," IEEE Journal of Solid-State Circuits, vol. 43, No. 8, Aug. 2008, pp. 1835-1845.

Lee, Kihoon et al. "A High-Speed Low-Complexity Concatenated BCH Decoder Architecture for 100 Gb/s Optical Communications," Springer Science+Business Media, LLC, Aug. 2010, 13 pages.

Notice of Allowance and Fee(s) Due mailed Apr. 13, 2016 in U.S. Appl. No. 14/316,128, 5 pages.

Notice of Allowance and Fee(s) Due mailed Apr. 28, 2016 in U.S. Appl. No. 14/316,117, 5 pages.

Notice of Allowance and Fee(s) Due mailed Jul. 20, 2016 in U.S. Appl. No. 14/316,128, 5 pages.

Notice of Allowance and Fee(s) Due mailed Aug. 8, 2016 in U.S. Appl. No. 14/316,117, 5 pages.

* cited by examiner

LOW COMPLEXITY PARTIAL PARALLEL ARCHITECTURES FOR FOURIER TRANSFORM AND INVERSE FOURIER TRANSFORM OVER SUBFIELDS OF A FINITE FIELD

FIELD OF THE DISCLOSURE

The present disclosure is generally related to architectures for Fourier transforms and inverse Fourier transforms.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

Fourier transforms and inverse Fourier transforms have been adopted in various technologies, such as data storage, signal processing, and communication systems. For example, architectures, such as very large scale integration (VLSI) architectures, have been developed for a Fourier transform and an inverse Fourier transform. These architectures may have fully parallel inputs and fully parallel outputs which make the architectures (e.g., fully paralleled architectures) complex and computationally intensive. Various techniques are needed to reduce complexity and computational intensity.

SUMMARY

Techniques are disclosed for performing Fourier transforms and inverse Fourier transforms over a subfield of a finite field. The use of a Fourier transform, such as a finite field Fourier transform (FT) and an inverse Fourier transform, such as an inverse finite field Fourier transform (IFT), may have broad applications in error-correcting coding, such as low-density parity check (LDPC) codes and Reed-Solomon codes. The techniques disclosed herein make use of composite field arithmetic and one or more properties of Fourier transforms (and inverse Fourier transforms) to create low-complexity partial-parallel architectures for the Fourier transform and the inverse Fourier transform over subfields of a finite field. Compared to previous partial parallel architectures, the disclosed FT and IFT architectures may achieve an order of magnitude complexity reduction.

DETAILED DESCRIPTION

Particular embodiments of the present disclosure are described below with reference to the drawings. In the description, common features may be designated by common reference numbers throughout the drawings.

Figure 1:
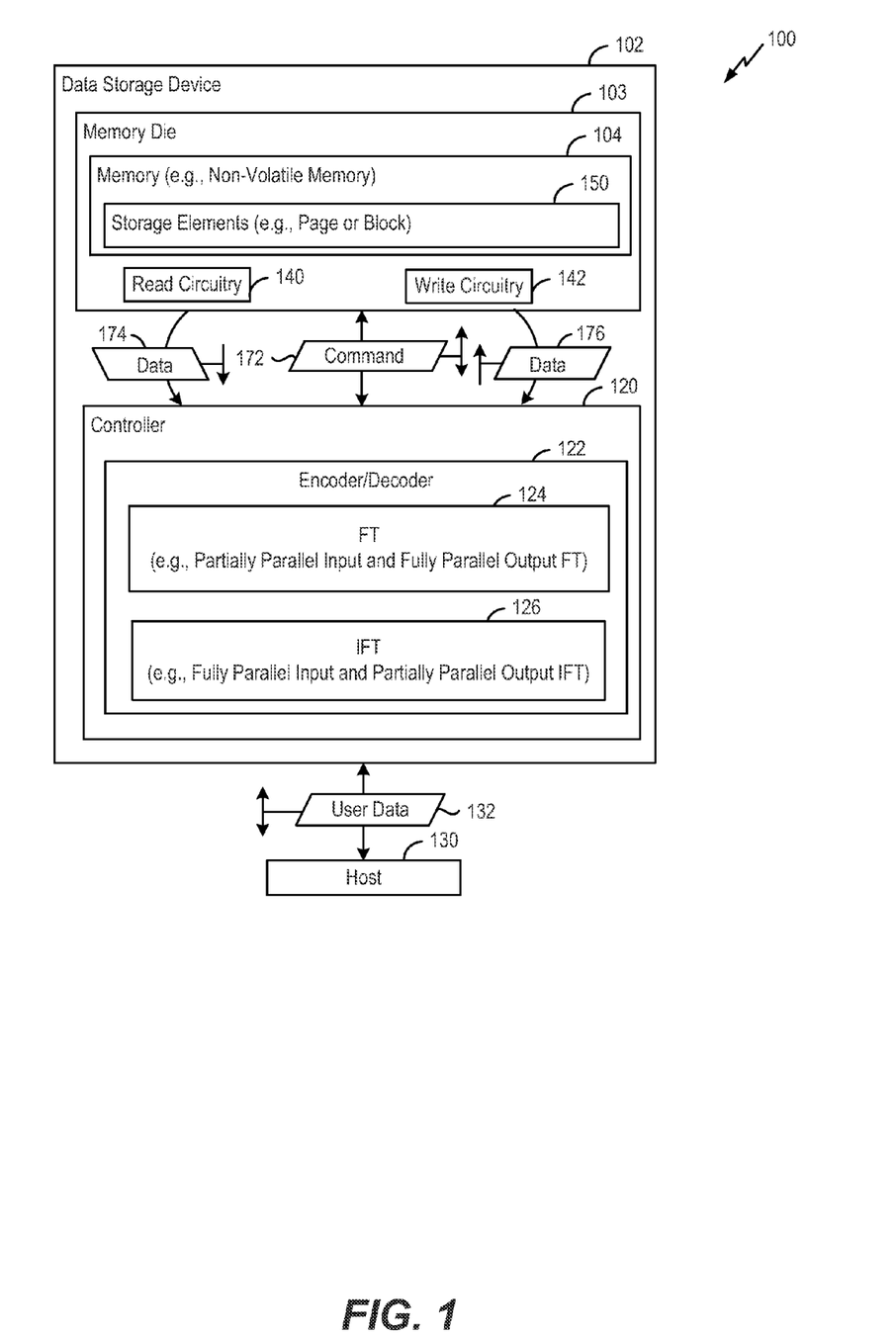
FIG. 1 is a block diagram of a particular illustrative embodiment of a system including a data storage device that includes circuitry that performs Fourier transforms and inverse Fourier transforms over subfields.

FIG. 1 is a block diagram of a particular illustrative embodiment of a system 100 including a data storage device 102 coupled to an accessing device, such as a host device 130. The data storage device 102 may be coupled to the host device 130 via a communication path, such as a wired communication path and/or a wireless communication path. The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof. The host device 130 may issue one or more commands to the data storage device 102, such as one or more requests to read data from or write data to a memory 104 of the data storage device 102. For example, the host device 130 may send data, such as user data 132 to be written to the memory 104 of the data storage device 102.

The data storage device 102 includes a controller 120 coupled to the memory 104, such as a non-volatile memory. The controller 120 may be coupled to the memory 104 via a bus, an interface, another structure, or a combination thereof. The memory 104 may include a two dimensional memory configuration or a three dimensional (3D) memory configuration. The memory 104 may store data, such as a representation of the user data 132.

The controller 120 may receive data and commands (e.g., instructions) from the host device 130 and may send data (and commands) to the host device 130. The controller 120 may send data and commands, such as a command 172, to the memory 104 and may receive data from the memory 104. For example, the command 172 sent by the controller 120 to the memory 104 may include one or more write commands to store data, such as the user data 132, to a specified address of the memory 104. A write command may specify a physical address of a portion of the memory 104 (e.g., a physical address of a wordline of the memory 104) that is to store the data. The controller 120 is configured to send one or more read commands to the memory 104 to access data from a specified address of the memory 104. As an example, the command 172 sent by the controller 120 to the memory 104 may include a read command to access a representation of the user data 132 stored in the memory 104. The read command may specify the physical address of a portion of the memory 104 (e.g., a physical address of a wordline storing the user data 132).

The controller 120 may include an encoder/decoder 122 configured to encode data, such as the data 176, written to the memory 104 and to decode data, such as the data 174, read from the memory 104. The encoder/decoder 122 may be included in an error correction code (ECC) engine (not shown). The encoder/decoder 122 may include a finite field Fourier transform (FT) circuit 124 and/or an inverse finite field Fourier transform (IFT) circuit 126 for performing Fourier transforms and inverse Fourier transforms over subfields of a finite field.

Figure 2:
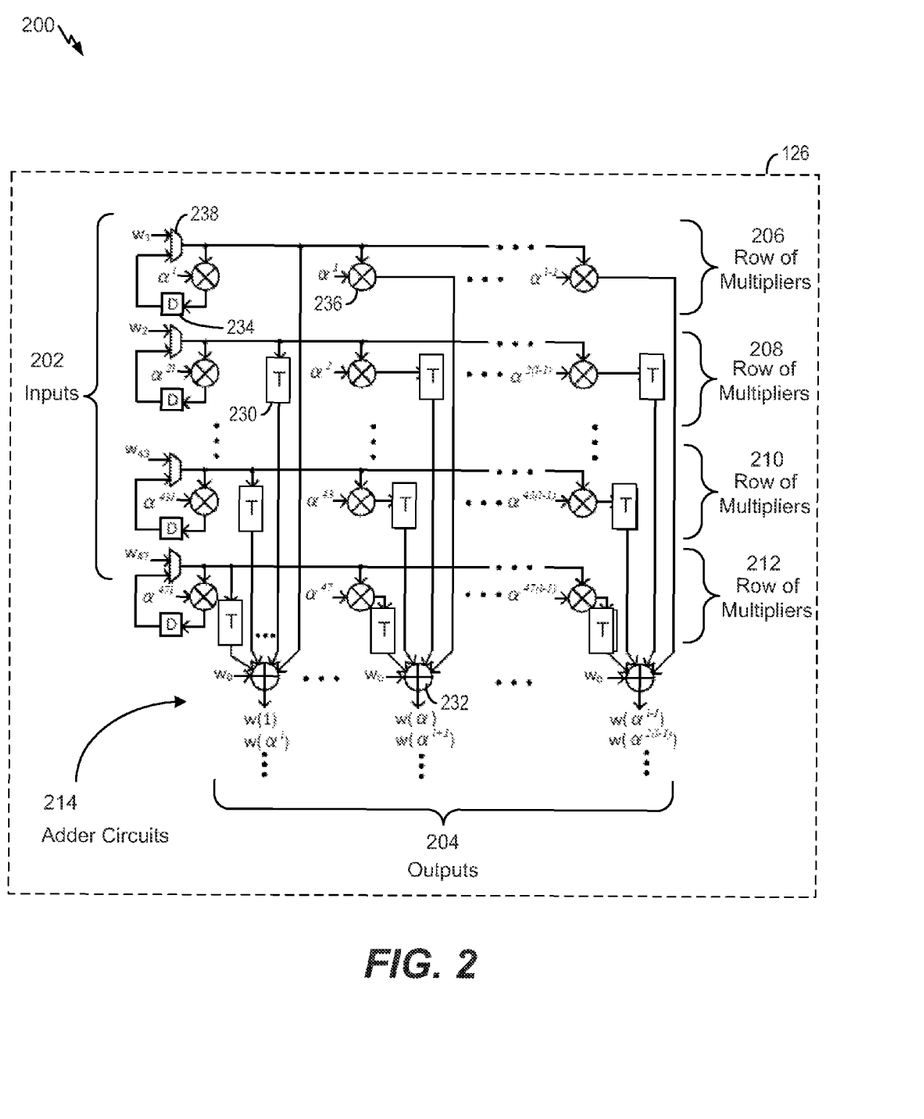
FIG. 2 is a block diagram illustrating an inverse Fourier transform circuit of FIG. 1.

The IFT circuit 126 may have a fully parallel input and a partially parallel output, as described further with respect to FIG. 2. For example, the IFT circuit 126 may include a number of inputs configured to receive a subset of an input vector having elements that are elements of a finite field and may include multiple outputs configured to output multiple sets of results that together produce an inverse Fourier transform result. The subset received by the IFT circuit 126 may include a number of values that is less than a number of elements of the input vector. For example, the subset may be determined (e.g., selected) based on the conjugacy classes formed by the elements of the finite field. To illustrate, the index of each value of the subset may be a leading value of a different cyclotomic coset of the finite field. Based on a configuration of the IFT circuit 126 having the fully parallel input (to receive a subset of the input vector) and a partially parallel output of subfield elements (to output the inverse Fourier transform result), the IFT circuit 126 may have an architecture including simplified multipliers and/or computational units as compared to inverse Fourier transform circuits that have traditional partial parallel designs.

Figure 3:
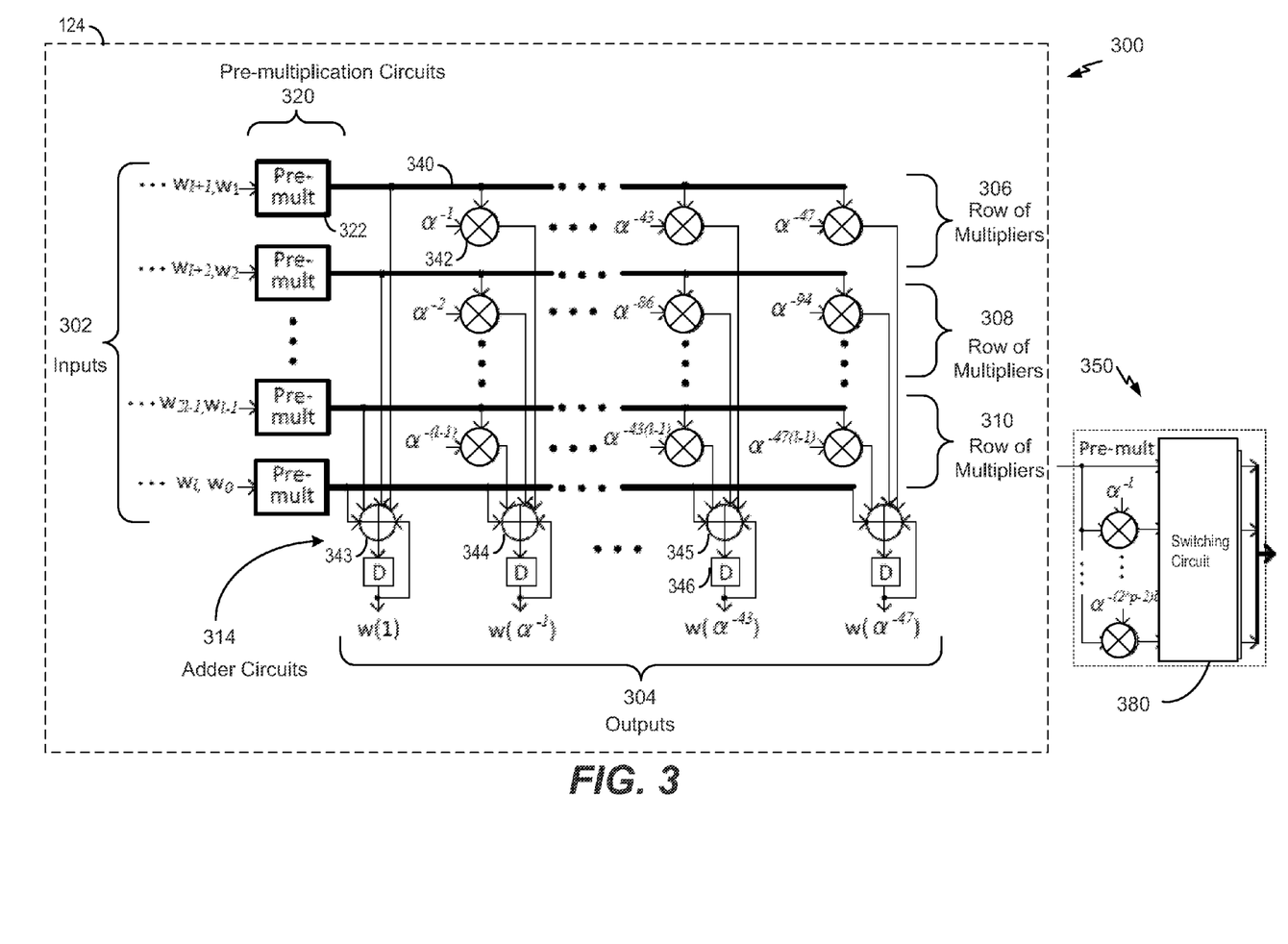
FIG. 3 is a block diagram illustrating a Fourier transform circuit of FIG. 1.

The FT circuit 124 may have a partially parallel input and a fully parallel output, as described further with respect to FIG. 3. For example, the FT circuit 124 may include a number of inputs configured to receive a subset of a vector having elements that are elements of a finite field or an entirety of the vector. To illustrate, at a first time, a first subset of the input vector may be received and, at a second time after the first time, a second subset of the input vector may be received. The first subset may be distinct from the second subset. The FT circuit 124 may also include multiple outputs configured to output multiple sets of results that together produce a Fourier transform result. Based on a configuration of the FT circuit 124 having the partially parallel input and a fully parallel output (to output the subset of the Fourier transform result), the FT circuit 124 may have an architecture including simplified multipliers and/or computational units as compared to Fourier transform circuits that have traditional partial parallel designs.

The encoder/decoder 122 may include an encoder portion (e.g., an encoder, such as a low-density parity check (LDPC) encoder) configured to perform encoding operations and/or a decoder portion (e.g., a decoder, such as an LDPC decoder) configured to perform decoding operations. The encoder/decoder 122 may receive the read values from the memory die 103 (e.g., the read circuitry 140). The encoder/decoder 122 (e.g., the ECC engine) may be configured to receive data, such as the user data 132, and to generate one or more error correction code (ECC) codewords (e.g., including a data portion and a parity portion) based on the data. For example, the encoder/decoder 122 may be configured to encode the data using an ECC encoding technique. The encoder/decoder 122 (e.g., the ECC engine) may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The encoder/decoder 122 (e.g., the ECC engine) may be configured to decode data read (e.g., read values) from the memory 104 to detect and correct errors, such as bit errors, that may be present in the data. The encoder/decoder 122 may receive the data, such as the data 174, and perform one or more decoding operations on the data. The encoder/decoder 122 (e.g., the ECC engine) may correct a number of errors, such as a number of bit errors, up to an error correction capability of a technique (e.g., an ECC technique) implemented by the encoder/decoder 122. A number of errors identified by the encoder/decoder 122 (e.g., the ECC engine) may be tracked by the controller 120, such as by the ECC engine. For example, based on the number of errors, the ECC engine may determine an error rate associated with one or more blocks of the memory 104.

Although not illustrated, the encoder/decoder 122 may include or be coupled to control logic, such as a processor or controller, configured to provide one or more control signals and/or elements to an input vector to the FT circuit 124 and/or the IFT circuit 126. Additionally or alternatively, the control logic may be configured to receive and/or output one or more output values of the FT circuit 124 and/or the IFT circuit 126.

The memory 104 may be included on a memory die 103 that is separate from the controller 120 and coupled to the controller 120 (e.g., via a bus). However, in other implementations, the memory 104 and the controller 120 may be included on a common die. The memory 104 may include multiple blocks each having multiple pages of storage elements. The example of FIG. 1 depicts that the memory 104 includes a plurality of storage elements 150, which may correspond to a block, a page (e.g., a physical page), or a wordline of the memory 104, as illustrative, non-limiting examples. Each storage element (e.g., memory cell or bit cell) of the storage elements 150 may be configured to store a data value (e.g., a bit value), such as "1" and "0." For example, each storage element may be programmable as a single-level cell (SLC) (e.g., a single bit per storage element) or a multi-level cell (MLC) (e.g., multiple bits per storage element).

The memory die 103 may further include read circuitry 140 and write circuitry 142 that are configured to enable operations of reading data, such as data 174, from the storage elements 150 of the memory 104 and writing data, such as data 176, to the storage elements 150 of the memory 104, respectively. The read circuitry 140 and the write circuitry 142 may be separate components of the memory die 103 or may be included in a single component of the memory die 103.

During operation of the data storage device 102, the controller 120 may receive the user data 132 from the host device 130 to be written to the memory 104. The controller 120 may send the command 172 that includes a write command to the memory die 103. The write command may command the memory 104 to write the user data 132 (or an encoded version (e.g., a codeword) of the user data 132) into a particular location in the memory 104, such as a location that may correspond to one or more of the storage elements 150. The encoder/decoder 122 may perform one or more operations associated with encoding the data, which may include a Fourier transform using the FT circuit 124 and/or an inverse Fourier transform using the IFT circuit 126. For example, an encoder (of the encoder/decoder 122) may use the FT circuit 124 and/or the IFT circuit 126 during an encoding operation performed on the user data 132 to generate a codeword to be stored in the memory 104.

After the user data 132 is written to the memory 104, the controller 120 may receive a read command from the host device 130. The controller 120 may send another command 172 that includes a read command. The encoder/decoder 122 may perform one or more decode operations on the value read from the memory 104. The decode operations may include a Fourier transform using the FT circuit 124 and/or an inverse Fourier transform using the IFT circuit 126. For example, a decoder (of the encoder/decoder 122) may use the FT circuit 124 and/or the IFT circuit 126 during a decoding operation performed on a value received from the memory 104.

Although the encoder/decoder 122 (e.g., the FT circuit 124 and/or the IFT circuit 126) has been illustrated and described with reference to data storage device 102 of FIG. 1, the encoder/decoder 122 may be included in devices and/or systems other than data storage device. For example, the encoder/decoder 122 (e.g., the FT circuit 124 and/or the IFT circuit 126) may be included in communication devices and/or communication systems, such as devices and systems using optical communication, digital communication, etc.

Previous Fourier transforms for finite fields and inverse field Fourier transforms for finite fields have been fully parallel (e.g., fully parallel inputs and outputs) with VLSI architectures that are complex and computationally intensive. To illustrate, when a is a primitive element of finite field $GF(2^r)$ and $e=2r-1$ and when $V=[\alpha^{-ij}u]$ ($0 \le i,j < e$) is an exe matrix over $GF(2^r)$, whose entry in the ith row and jth column is $a^{-ij}$, the finite field Fourier transform of the e-tuple vector, $W=[w_0, w_1, \ldots, w_{e-1}]$ where $w_n$ are finite field elements, is defined as $$\mathcal{F}(\omega) = \omega V = \omega \begin{bmatrix} 1 & 1 & 1 & 1 & \ldots \\ 1 & \alpha^{-1} & \alpha^{-2} & \alpha^{-3} & \ldots \\ 1 & \alpha^{-2} & \alpha^{-4} & \alpha^{-8} & \ldots \\ \vdots & \vdots & \vdots & \vdots & \ddots \\ 1 & \alpha^{-(e-1)} & \alpha^{-(e-2)} & \alpha^{-(e-3)} & \ldots \end{bmatrix} \quad (1)$$

The inverse of V is $V^{-1}=[\alpha^{ij}]$, and the inverse finite field Fourier transform of a vector w is $$\mathcal{F}^{-1}(\omega) = \omega V^{-1} = \omega \begin{bmatrix} 1 & 1 & 1 & 1 & \ldots \\ 1 & \alpha & \alpha^2 & \alpha^3 & \ldots \\ 1 & \alpha^2 & \alpha^4 & \alpha^8 & \ldots \\ \vdots & \vdots & \vdots & \vdots & \ddots \\ 1 & \alpha^{e-1} & \alpha^{e-2} & \alpha^{e-3} & \ldots \end{bmatrix}$$

If the symbols in w are considered as coefficients of a polynomial $w(x)=w_0+w_1x+ \ldots +w_{e-1}x^{e-1}$, it may be assumed that $F(w)=[d_0, d_1, \ldots, d_{e-1}]$ and $d_i=w(\alpha^{-i})$ from equation (1). Similarly, if $F^{-1}(w)=[f_0, f_1, \ldots, f_{e-1}]$, then $f_i=w(\alpha^{-i})$. Thus, the Fourier transform and the inverse Fourier transform over finite fields can be considered equivalently as evaluation value computations.

The evaluation values of a polynomial over consecutive finite field elements in terms of power representation can be implemented by a Chien search. The 1-parallel Chien search architecture may compute 1 evaluation values at a time, and uses 1(e-1) constant multipliers and 1(e-2) 2-input adders over $GF(2^r)$ for a degree e-1 polynomial. Although constant multipliers may be less complicated than general multipliers, such a large number of constant multipliers and adders over $GF(2^r)$ would lead to large area requirement associated with the 1-parallel Chien search architecture.

Low-complexity VLSI architectures may be utilized to implement the Fourier transform (performed by the FT circuit 124) and inverse Fourier transform (performed by the IFT circuits 126) when the inputs or outputs are elements of subfields of a finite field. For example, the low-complexity partial-parallel architectures for the Fourier transform and the inverse Fourier transform over subfields of a finite field may be realized through use of composite field arithmetic and one or more properties of Fourier transforms (and inverse Fourier transforms), as described further herein.

To illustrate, the Fourier transform may be applied to an e-tuple vector whose symbols are elements of subfield $GF(2^p)$, where $e=2r-1$ and p divides r. An e-tuple vector is over subfield $GF(2^p)$ if and only if the symbols in the corresponding Fourier transform satisfy the conjugacy constraints $$d_{(2^p)^i \pi} = d_i^{2^p} \quad (2)$$

The indexes of the symbols that satisfy the conjugacy constraints may form cyclotomic cosets. The cardinality of the cyclotomic coset containing i may be denoted by $\eta_i$. A low-complexity partial-parallel architecture for the inverse Fourier transform over subfields of a finite field is described with reference to FIG. 2. A low-complexity partial-parallel architecture for the Fourier transform over subfields of a finite field is described with reference to FIG. 3. The low-complexity partial-parallel architectures for the Fourier transform and the inverse Fourier transform over subfields of a finite field may be realized through use of composite field arithmetic and one or more properties of Fourier transforms and inverse Fourier transforms over subfields, as described further herein.

Referring to FIG. 2, a particular illustrative embodiment of the inverse finite field Fourier transform circuit 126 of FIG. 1 is depicted and designated 200. The inverse finite field Fourier transform circuit 126 may be configured to receive inputs that satisfy a conjugacy constraint and to generate outputs that are subfield elements of a finite field, as described further herein.

The IFT circuit 126 may include inputs 202, outputs 204, rows of multipliers 206-212, and adder circuits 214. The inputs 202 may include a first number of inputs that are each configured to receive an element of an input vector. For example, the elements of the input vector satisfy the conjugacy constraint. To illustrate, the elements of the input vector may include $w_1$, $w_2$, $w_{43}$, and $w_{47}$, as an illustrative, non-limiting example. The first number may be less than a number of elements of the input vector. An index of each of the inputs 202 may be decided by (e.g., determined based on) cyclotomic cosets formed by the elements of the finite field, as described further herein. For example, each input may correspond to a different cyclotomic coset. Each input may be provided to a first input of a corresponding multiplexor, such as a representative multiplexor 238. An output of the multiplexor 238 may be provided as feedback to a second input of the multiplexor 238. The output of the multiplexor 238 may be provided to the second input of the multiplexor 238 via a multiplier (denoted by the symbol "⊗") and a delay element "D", such as a representative delay element 234. Although only four inputs are illustrated in the IFT circuit 126, the inputs 202 may also include more than four inputs or fewer than four inputs.

Multipliers included in the rows of multipliers 206-212 may be coupled to the inputs 202 and may be configured to compute a p bit product, such as a 2 bit product for $GF(2^2)$. For example, each input of the inputs 202 may be associated with a corresponding row of the multipliers. Each of the rows of multipliers 206-212 may include one or more multipliers, such as the first row of multipliers 206 that includes a representative multiplier 236. Each of the rows of multipliers 206-212 may output one or more intermediate values. The one or more intermediate values may be used to determine one or more inverse finite field Fourier transform results. For example, when the computations over $GF(2^6)$ are carried out using composite field arithmetic over $GF((2^2)^3)$, then each multiplier of a particular row of multipliers may be configured to compute products that are elements of $GF(2^2)$. The one or more intermediate values may be provided to adder circuits 214 (e.g., each adder circuit denoted by the symbol "s") including a representative adder circuit 232. Although only three adder circuits 214 are illustrated in the IFT circuit 126, the adder circuits 214 may include more than three adder circuits or fewer than three adder circuits.

The outputs 204 may include second number of outputs coupled to the multipliers of the rows of multipliers 206-212. The outputs 204 may be configured to output inverse finite field Fourier transform results. Additionally, the IFT circuit 126 may also include one or more trace computation units (e.g., each trace computation unit denoted "T"), such as a representative trace computation unit 230, as described further herein. Each trace computation unit is coupled between an output of one of the multipliers and a corresponding adder.

During a first iteration of the IFT 216, each multiplexor may receive a corresponding input value (of the inputs 202) and provide the input value to a corresponding row of multipliers (of the rows of multipliers 206-212). For example, the input values may satisfy the conjugacy constraints. Each row of multipliers may generate one or more first intermediate values that are provided to the adder circuits 214. In some embodiments, first intermediate values of one or more rows of the rows of adders may be provided to the adder circuits 214 via trace computation units. Each adder (of the adder circuits 214) may output a corresponding output value (of the outputs 204). For example, each output value may be a subfield element of a finite field. A first set of output values may include $w(1), w(\alpha), \ldots,$ and $w(a^{l-1})$, as an illustrative, non-limiting example. To illustrate, the multiplexor 238 may receive an input value $w_1$ and provide the input value $w_1$ to the first row of multipliers 206. The first row of multipliers 206 may generate first intermediate values based on the input value $w_1$. The first intermediate values may be provided to the adder circuits 214. The adder circuits 214 may output a first set of results based on the first iteration.

During a second iteration of the IFT 126 that is a next sequential iteration after the first iteration, each multiplexor may provide, to the row of multipliers corresponding to the multiplexor, a multiple of an input value that is received from a corresponding delay element. Each row of multipliers may generate one or more second intermediate values that are provided to the adder circuits 214. In some embodiments, second intermediate values of one or more rows of adders may be provided to the adder circuits 214 via trace computation units. Each adder (of the adder circuits 214) may generate a corresponding output value based on the values received from multiple rows of multipliers and/or from the trace computation units. For example, each output value may be a subfield element of a finite field. A second set of output values may include $w(\alpha^l), w(\alpha^{l+1}), \ldots,$ and $w(\alpha^{2(l-1)})$, as an illustrative, non-limiting example. To illustrate, the multiplexor 238 may provide a feedback value (e.g., $a^l w_1$) received from the delay element D 234 to the first row of multipliers 206. The first row of multipliers 206 may generate second intermediate values based on the feedback value. The second intermediate values may be provided to the adder circuits 214. The adder circuits 214 may output a second set of results based on the second iteration.

The inverse Fourier transform architecture (e.g., the IFT 126 of FIG. 1) can be arrived at by simplifying the 1-parallel Chien search architecture. For example the inverse Fourier transform whose output is a vector over subfield $GF(2^p)$, the constant multipliers used in the 1-parallel Chien search architecture can be simplified by adopting composite field arithmetic. To illustrate, $GF(2^r)$ may be isomorphic to the composite field $GF((2^p)^t)$ if r=pt and an element $a \in GF((2^p)^t)$ can be represented as a polynomial in x with maximum degree t−1, $a_{t-1}x^{t-1} + \ldots + a_1 x + a_0$, whose coefficients are elements of $GF(2^p)$. For those elements also belonging to the subfield $GF(2^p)$, $a_0$ is nonzero, and $a^1, a_2, \ldots, a_{t-1}$ are all zero. The outputs of the constant multipliers in the 1-parallel Chien search architecture, except the multipliers in a first column of multipliers, only go through adders before the inverse Fourier transform outputs are derived. Finite field additions may be implemented as bit-wise XOR circuits. Therefore, those multipliers may compute only the $a_0$ coefficients in the products, and accordingly have approximately 1/t the complexity of pt-bit constant multipliers.

The inverse Fourier transform architecture used in the 1-parallel Chien search architecture can be further simplified by making use of the property that the input, w, satisfies the conjugacy constraints. It can be derived that $$\omega_{(2^{p\mu}i)_x} \alpha^{j(2^{p\mu}i)} = \omega_i^{2p\mu} \alpha^{j(2p\mu i)} = (\omega i \alpha^{ji})^{2p\mu}$$

for $\mu=0$, The trace of an element $a \in GF(qt)$ may be defined as $$Tr(\alpha) = \Sigma_{i=0}^{i-1} \alpha_q^i$$

Therefore, for those cyclotomic cosets with $\eta_i = t$, $$\Sigma_{\mu=0}^{\eta_i - 1} \omega_{(2^{p\mu}i)_x} \alpha^{j(2^{p\mu}i)} = Tr(\omega_i \alpha^{ji}) \quad (3)$$

$\eta_i$ is a divisor of t for composite field $GF((2^p)^t)$, and most of the cyclotomic cosets have $\eta_i = t$. From equation (3), the sum of the evaluation values corresponding to the $w_i$'s in each of those cyclotomic cosets with $\eta_i i = t$ is equal to the trace of the evaluation value corresponding to the leading $w_i$ of the coset. The trace of an element in $GF((2^p)^t)$ may be an element in $GF(2^p)$. For $a = a_{t-1} x^{t-1} + \ldots + a_1 x + a_0$, $Tr(a) = a_{t-1} Tr(x^{t-1}) + \ldots + a_1 Tr(x) + a_0 Tr(1)$. $Tr(x^{t-1}), \ldots Tr(x)$, and $Tr(1)$ can be pre-computed. Then the trace of an element in $GF((2^p)^t)$ may be derived by constant multiplications over $GF(2^p)$. Based on this, the IFT circuit 126 may be achieved that includes a reduced-complexity architecture for the inverse Fourier transform over subfields. Each trace computation unit, such as the representative trace computation unit 230, may compute trace values based on one or more multipliers over subfield to provide outputs (e.g., calculated products) to one or more adders. As described above, each multiplier is a constant multiplier where a constant value corresponds to a pre-computed trace value of a basis element (e.g., Tr(x), Tr(1), etc.). As described further below, trace computation units complexity may be further reduced and in some embodiments the trace computation units may be eliminated from the IFT circuit 126.

To clarify the indexes of the signals (e.g., input signals and/or output signals), an illustrative example of the IFT circuit 126 may be the case of the inverse Fourier transform over a finite field $GF(2^6)$ (r=6) where inputs are elements of $GF(2^6)$ that satisfy the conjugacy constraint and the outputs are elements of the subfield $GF(2^2)$ (p=2). For this example, the computations may be performed over composite field $GF((2^2)^3)$, and the corresponding cyclotomic cosets may be:

| {0} | {21} | {42} |
|---|---|---|
| {1, 4, 16} | {2, 8, 32} | {3, 12, 48} |
| {5, 20, 17} | {6, 24, 33} | {7, 28, 49} |
| {9, 36, 18} | {10, 40, 34} | {11, 44, 50} |
| {13, 52, 19} | {14, 56, 35} | {15, 60, 51} |
| {22, 25, 37} | {23, 29, 53} | {26, 41, 38} |
| {27, 45, 54} | {30, 57, 39} | {31, 61, 55} |
| {43, 46, 58} | {47, 62, 59} | |

Instead of having one row of multipliers for each $w_i$ as in the 1-parallel Chien search architecture, the architecture in the IFT circuit 126 has one row of multipliers for the leading $w_i$ in each cyclotomic coset with cardinality t. Accordingly, the architecture in the IFT circuit 126 may have a fewer number of inputs as compared to the 1-parallel Chien search architecture. The sum of the evaluation values corresponding to all the $w_i$'s in each of those cosets may be derived by the trace. As a result, the number of multipliers has been reduced by approximately t times as compared to the architecture in the 1-parallel Chien search architecture. On the other hand, if t' of $Tr(x^{t-1})$, ... $Tr(x)$, and $Tr(1)$ are nonzero, then t' constant multipliers over $GF(2^p)$ may be needed to compute the trace. Using different irreducible polynomials to construct $GF((2^p)^t)$, the traces of the basis elements vary. A proper irreducible polynomial can be chosen to reduce the complexity of the trace computation. For example, in the case that p=2, t=3, and the irreducible polynomial $x^3+\Phi$ over $GF(2^2)$ with $\Phi$='10' is used to construct $GF((2^2)^3)$ from $GF(2^2)$, $Tr(x^2)=Tr(x)=0$ and $Tr(1)=1$. Accordingly, the trace blocks depicted in the IFT circuit 126 can be eliminated, and the multipliers, except those in the first column, only need to compute two bits in the products.

Compared to the 1-parallel Chien search architecture, the 1-parallel inverse finite field Fourier transform architecture in the circuit 126 may decrease the number of multipliers by almost t times, and may reduce the complexity of each multiplier by t times. Another advantage of the architecture of the IFT circuit 126 is that the IFT circuit 126 does not require the non-leading symbols of the cyclotomic cosets at the input. Accordingly, when the IFT circuit 126 is used in encoders, such as LDPC encoders, the non-leading symbols do not need to be computed by the transformed generator matrix multiplication, and hence the number of multipliers may be reduced by almost t times. Thus, the low-complexity partial-parallel architecture for the inverse Fourier transform over subfields of a finite field may be realized through use of composite field arithmetic and one or more properties of inverse finite field Fourier transforms. As a result, the 1-parallel inverse finite field Fourier transform architecture in the circuit 126 may have a more compact design as compared to the 1-parallel Chien search architecture.

Referring to FIG. 3, a particular illustrative embodiment of the finite field Fourier transform circuit 124 of FIG. 1 is depicted and designated 300. The finite field Fourier transform circuit 124 may be configured to receive inputs that are subfield elements of a finite field and to generate outputs that satisfy conjugacy constraints, as described further herein. The FT circuit 124 may have a partially parallel input and a fully parallel output.

The FT circuit 124 may include inputs 302, outputs 304, rows of multipliers 306-310, a group of adder circuits 314, and a group of pre-multiplication circuits 320. Each input of the inputs 302 may be coupled to a corresponding pre-multiplication circuit, such as a representative pre-multiplication circuit 322, of the pre-multiplication circuits 320 (e.g., each pre-multiplication circuit denoted "Pre-mult"). Although only four inputs are illustrated in the FT circuit 124 of FIG. 3, the inputs 302 may also include more than four inputs or fewer than four inputs.

Each of the inputs 302 may be configured to sequentially receive multiple elements of an input vector and provide the multiple elements to the pre-multiplication circuits 320. For example, at a first time, the group of pre-multiplication circuits 320 may receive a first subset of the input vector and, at a second time after the first time, the group of pre-multiplication circuits 320 may receive a second subset of the input vector. The first subset may be distinct from the second subset. The first subset may include input values of $w_1, w_2, w_{l-1}, \ldots,$ and $w_0$ and the second subset may include input values of $w_{l+1}, w_{l+2}, w_{2l-1}, \ldots,$ and $w_l$, as illustrative, non-limiting examples.

Each pre-multiplication circuit may include an input configured to receive an element of an input vector. Each pre-multiplication circuit may be configured to generate, for each received element of the multiple elements, a corresponding plurality of multiples of the received element. Additionally, each pre-multiplication circuit includes a multiplier configured to generate at least one of the plurality of multiples. An illustrative example of a particular pre-multiplication circuit of the group of pre-multiplication circuits 320 is depicted at 350.

The particular pre-multiplication circuit may include a switching circuit 380, such as a switch (e.g., a router), configured to receive a plurality of multiples of the received input element (e.g., the multiples output by one or more multipliers in the pre-multiplication circuit) and to route each multiple to a corresponding computation path that includes an adder circuit of the adder circuits 314. For example, the switching circuit 380 may be coupled to a multi-line bus to route each multiple via a distinct line. To illustrate, when the representative pre-multiplication circuit 322 includes the particular pre-multiplication circuit (illustrated at 350), the switching circuit 380 may be coupled to a representative multi-line bus 340. A first line of the multi-line bus 340 may be coupled to a first representative adder circuit 343 of the adder circuits 314. One or more other lines of the multi-line bus 340 may be coupled via a multiplier to an adder circuit, such as a second representative adder circuit 344, of the adder circuits 314. For example, a second line of the multi-line bus 340 may route a multiple of the element received at the pre-multiplication circuit 322 to an input of the multiplier 342. An output of the multiplier 342 may be provided to an input of the second adder circuit 344.

A configuration of the switching circuit 380 may change with each iteration of the FT circuit 124. For example, during a first iteration of the FT circuit 124, the pre-multiplication circuit 322 may receive an input $w_i$ and route the input $w_1$, via the switching circuit (e.g., the switching circuit 380), to the first adder circuit 343. During the first iteration the pre-multiplication circuit 322 may generate a multiplied input $w_1 \cdot \alpha^{-1}$ and may route the multiplied input AA/you/to another adder circuit (e.g., the adder circuit 344) via a multiplier (e.g., the multiplier 342) of the row of multipliers 306. During a next iteration of the FT circuit 124, the pre-multiplication circuit 322 may receive an input $w_{i+1}$ and route the input $w_{l+1}$, via the switching circuit (e.g., the switching circuit 380), to a first multiplier of the row of multipliers 306. Also during the next iteration, the pre-multiplication circuit 322 may generate a multiplied input $w_{l+1} \cdot \alpha^{-1}$ and may route the multiplied input $w_{l+1} \cdot \alpha^{-1}$ to another multiplier of the row of multipliers 306.

As illustrated, each pre-multiplication circuit of the group of pre-multiplication circuits 320 may be coupled to corresponding row of multipliers 306-310 (e.g., each multiplier denoted by the symbol "⊗"). For example, the pre-multiplication circuit 322 is coupled to the row of multipliers 306. Each of the rows of multipliers 306-310 may include one or more multipliers, such as the first row of multipliers 306 that includes the representative multiplier 342. Each of the rows of multipliers 306-310 may output one or more intermediate values. The one or more intermediate values may be used to determine one or more finite field Fourier transform results.

Each row of multipliers of the multiple rows of multipliers 306-310 may be coupled to an output of a respective pre-multiplication circuit and may be configured to generate an intermediate value of a finite field Fourier transform of the input vector. Additionally, for each row of multipliers, each multiplier in the row of multipliers may be associated with a different multiplier value.

The one or more intermediate values may be provided to adder circuits 314 (e.g., each adder circuit denoted by the symbol "⊗") including the representative adder circuits 343, 344. The group of adders 314 (e.g., group of adder circuits) may be configured to output elements of an output vector that corresponds to the finite field Fourier transform of the input vector. For example, the output vector may include elements $w(1)$, $w(\alpha^{-1})$, $w(\alpha^{-43})$, and $w(\alpha^{-47})$, as an illustrative, non-limiting example. Although only four adder circuits 314 are illustrated in the FT circuit 124 of FIG. 3, the adder circuits 314 may include more than four adder circuits or fewer than four adder circuits. At least one of the adders of the group of adders 314 may be coupled to one of the pre-multiplication circuits of the group of pre-multiplication circuits 320 and coupled to one of the multipliers included in a particular row of multipliers of the multiple rows of multipliers 306-310. An output of each adder of the group of adders 314 may be provided as a feedback value to the adder, as illustrated as a feedback loop and a delay element "D", such as a representative delay element D 346. The final output elements (e.g., the output 304) that are output by the group of adders 314 may satisfy the conjugacy constraints. For example, the output elements may be a subset of the output vector (e.g., having elements that are elements of a finite field). Each value of the subset may be a leading value of a different cyclotomic coset. Accordingly, the other elements in the output vector may be derived based on the subset.

The Fourier transform architecture (e.g., the FT 124 of FIG. 1) can be arrived at by simplifying the 1-parallel Chien search architecture. For example, assume that the input vector is $w=[w_0, w_1, \ldots w_{e-1}]$, the Fourier transform is to compute $w(\alpha^{-j})$ for $j=0, 1, \ldots e-1$, where a is a primitive element of $GF(2^r)$ and $e=2^r-1$. When the inputs of the Fourier transform are elements of the subfield $GF(2^p)$, where p divides r, the outputs may be elements of $GF(2^r)$ satisfying the conjugacy constraints in equation (2). Accordingly, because the outputs satisfy the conjugacy constraints (and the other elements of the output vector can be derived from the output elements that correspond to the leading elements of the cyclotomic cosets), the architecture in the FT circuit 124 may have a fewer number of outputs as compared to the 1-parallel Chien search architecture. By making use of the subfield inputs and conjugacy constraints satisfied by the outputs, the architecture of the 1-parallel Chien search architecture for implementing the Fourier transform can be also simplified to arrive at the FT circuit 124.

Similarly, only a leading symbol in each cyclotomic coset needs to be computed, such as a value of a leading symbol as represented by one of the outputs 304. The other symbols can be derived by square operations if needed, such as derived by one or more circuits within the encoder/decoder 122 of the data storage device 102 of FIG. 1. However, the irregularity in the indexes of the leading symbols makes it very difficult to skip the computations of those non-leading symbols in the Fourier transform using an output-wise partial-parallel architecture, such as those in the 1-parallel Chien search architecture and the 1-parallel inverse finite Fourier transform architecture of the implementation of the circuit 126 of FIG. 2. Instead, output-parallel and input-wise partial-parallel designs should be exploited to take advantage of the conjugacy constraints and at the same time keep the hardware implementation cost low. In an l-parallel architecture for Fourier transform, such as the FT circuit 124, the inputs may be multiplied by powers of $a^j$. Although the inputs are $GF(2^p)$ symbols, the products may be $GF(2^r)$ (r=pt) symbols and they may be used as the inputs to the other constant multipliers. Hence, the other constant multipliers may be pt-bit multipliers. As a result, subfield elements may not be exploited in the same way as in the inverse Fourier transform, such as the IFT circuit 126 of FIG. 1, to reduce the multiplier complexity even if composite field arithmetic is adopted. One solution to this problem may be to make the parallel processing factor l equal $e/(2^p-1)$. In this case, $\alpha^l$ is an element of the subfield $GF(2^p)$ and only the $a_0$ coefficient in its corresponding polynomial representation is nonzero. By dividing the Fourier transform inputs into groups of l symbols, it can be derived that:

$$\omega(\alpha^{-j}) = \quad (4)$$
$$\omega_0 + \omega_1\alpha^{-j} + \ldots + \omega_{l-1}\alpha^{-j(l-1)} + w_l\alpha^{-jl} + w_{l+1}\alpha^{-j(l+1)} + \ldots +$$
$$w_{2l-1}\alpha^{-j(2l-1)} + w_{2l}\alpha^{-j(2l)} + w_{2l+1}\alpha^{-j(2l+1)} + \ldots + w_{3l-1}\alpha^{-j(3l-1)} +$$
$$\ldots = w_0 + w_1\alpha^{-j} + \ldots + w_{l-1}\alpha^{-j(l-1)} + w_l\alpha^{-jl} +$$
$$(w_{l+1}\alpha^{-jl})\alpha^{-j} + \ldots + (w_{2l-1}\alpha^{-jl})\alpha^{-j(l-1)} + w_{2l}\alpha^{-2jl} +$$
$$(w_{2l+1}\alpha^{-2jl})\alpha^{-j} + \ldots + (w_{3l-1}\alpha^{-2jl})\alpha^{-j(l-1)} + \ldots$$

Therefore, if l symbols of $w_i$ are input at a time, each group of symbols can be multiplied by the same 1, $\alpha^{-j}$, $\alpha^{-2j}, \ldots \alpha^{-j(l-1)}$ vector in the computation of $w(\alpha^{-j})$ if they are pre-multiplied with $\alpha^{-jl}$, $\alpha^{-2jl}$, . . . in subsequent clock cycles. By choosing $l=e/(2^p-1)$, only the $a_0$ coefficients in the polynomial representations of $\alpha^{-jl}$, $\alpha^{-2jl}$ . . . . may be nonzero. As a result, the subsequent multiplications with 1, $\alpha^{-j}, \alpha^{-2j}, \ldots \alpha^{-j(l-1)}$ can be performed by simplified constant multipliers, whose complexity is also approximately 1/t the complexity of pt-bit constant multipliers.

To clarify the indexes of the signals (e.g., input signals and/or output signals), an illustrative example of the FT circuit 124 may include input symbols that are elements of $GF(2^2)$, and outputs that are elements of $GF((2^2)^3)$ satisfying the conjugacy constraints. Each pre-multiplication block of the FT circuit 124 may multiply the input with $\alpha^{-l}$, $\alpha^{-2l}, \ldots, \alpha^{-(2^p-2)^l}$. In the case of p=2, there may be only two constant multipliers over $GF(2^2)$ in each pre-multiplication block, and each of them may be implemented by one XOR gate. Then the products are switched to be sent to the array of constant multipliers according to equation (4). If using parallel processing factor $l=e/(2^p-1)$ does not achieve desired throughput, then fully-parallel design can be adopted. The constant multipliers in a fully-parallel architecture also multiply $GF(2^p)$ symbols with $GF((2^p)^t)$ constants. However, if other parallel processing factors are adopted, each constant multiplier may compute the product of a $GF((2^p)^t)$ symbol and a $GF((2^p)^t)$ constant, and the design becomes cost-ineffective.

For a vector of length e, the Fourier transform exists in the extension field $GF(2^q)$ if there is an element of order e in $GF(2^q)$. The order of any element in $GF(2^q)$ must divide $2^q-1$, and the maximum order is $2^q-1$, in which case the element is primitive. If e is assumed to be equal to $2^r-1$, the Fourier transform may be performed over $GF(2^r)$. In the case that e is not in the format of $2^r-1$, then the smallest extension field $GF(2^q)$ for which e is a divisor of $2^r-1$ may be found first, and then the Fourier transform may be performed over $GF(2^q)$. The simplified Fourier transform architecture (e.g., the FT circuit 124 of FIG. 1) and inverse Fourier transform architecture (e.g., the IFT circuit 126) in this disclosure can be also adopted for this latter case, such as in cases where $e \neq 2^r-1$.

When the Fourier transform and inverse Fourier transform over finite fields are implemented using the 1-parallel Chien search architecture, the inverse Fourier transform of a vector of length $e=2^r-1$ over $GF(2^r)$ uses el r-bit constant multipliers, even if the output symbols are elements from a subfield $GF(2^p)$, where p divides r. Assume r=pt. By adopting composite field arithmetic and making use of the subfield elements and conjugacy constraints, the proposed l-parallel inverse Fourier transform architecture, such as the IFT circuit 126 of FIG. 1, only uses e'l p-bit constant multipliers, where e' is the total number of cyclotomic cosets. e' is approximately $2^r/t$, and hence is much smaller than e. As a result, the complexity of the inverse Fourier transform, such as the IFT circuit 126 of FIG. 1, is reduced by around $t^2$ times as compared to the 1-parallel Chien search architecture. For the Fourier transformation, such as the FT circuit 124 of FIG. 1, in the case of fully-parallel processing or when the parallel processing factor is $e/(2^p-1)$, the subfield element and conjugacy constraints may be utilized in the same way to reduce the complexity by almost $t^2$ times. For other parallel processing factors, the subfield inputs do not contribute to simpler constant multipliers. Nevertheless, by exploiting the conjugacy constrains, the number of constant multipliers of the Fourier transformation, such as the FT circuit 124 of FIG. 1, is reduced by $e/e' \approx t$ times compared to the 1-parallel Chien search architecture. Although the Fourier transform, such as the FT circuit 124 of FIG. 1, and the inverse Fourier transform, such as the IFT circuit 126 of FIG. 1, have been described with reference to encoders and/or decoders (e.g., the encoder/decoder 122) of a data storage device, the Fourier transform and the inverse Fourier transform described herein may also be application to communication systems, signal processing systems, and other systems that utilize Fourier transformation over finite fields, as illustrative, non-limiting examples.

By making use of composite field arithmetic and the property of Fourier transform in addressing the Fourier transform of e-tuple vectors whose symbols are elements of subfield $GF(2^p)$, where $e=2^r-1$ and p divides r, low-complexity partial-parallel architectures may be realized for the Fourier transform and inverse over subfields. Compared to the 1-parallel Chien search architecture, the proposed architectures for the FT and the IFT can achieve an order of magnitude complexity reduction, depending on the size of the finite field involved. The low-complexity partial-parallel architecture for the Fourier transform over subfields of a finite field may be realized through use of composite field arithmetic and one or more properties of finite field Fourier transforms.

Figure 4:
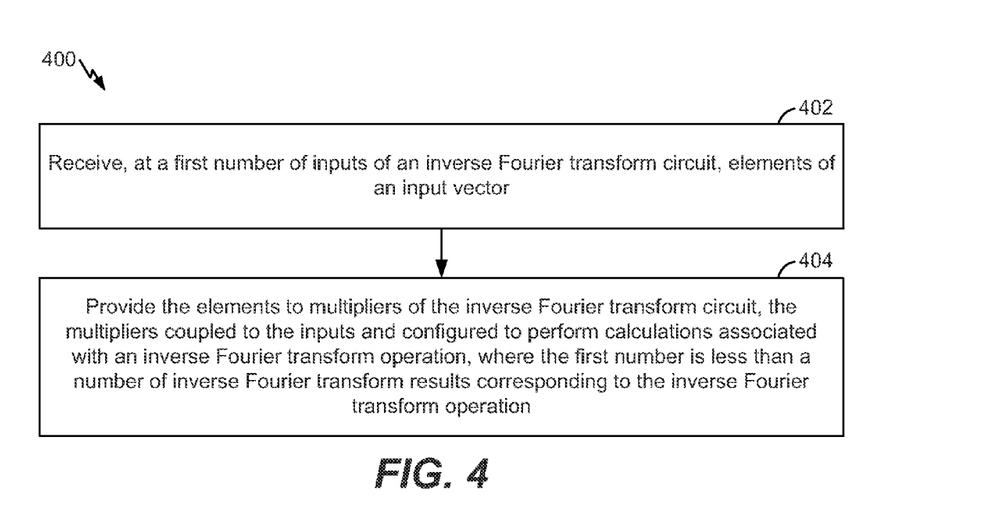
FIG. 4 is a flow diagram of an illustrative method of performing an inverse Fourier transform.

Referring to FIG. 4, an illustrative embodiment of a method 400 of performing an inverse Fourier transform is shown. For example, the method 400 may be performed by an inverse Fourier transform circuit, such as the inverse finite field Fourier transform circuit 126 of FIG. 1. For example, the inverse Fourier transform circuit may be included in an encoder and/or a decoder, such as the encoder/decoder 122 of the data storage device 102 of FIG. 1. The inverse Fourier transform circuit may be configured to receive inputs that satisfy a conjugacy constraint and to generate outputs that are subfield elements of a finite field. The inverse Fourier transform circuit may have a first number of inputs and may have multipliers coupled to the inputs.

The method 400 includes receiving, at the inputs of the inverse Fourier transform circuit, elements of an input vector, at 402. The first number of inputs may be associated with cyclotomic cosets formed by the elements of a finite field. For example, each input may corresponds to a different cyclotomic coset. Accordingly, the elements of the input vector may be a subset of the input vector and the inputs of the inverse Fourier transform may be considered to be fully parallel (to receive the subset of the input vector). The inputs may include or correspond to the inputs 202 of FIG. 2. The first number may also be less than a second number of elements included in the input vector.

The method 400 further includes providing the elements to the multipliers of the inverse Fourier transform circuit, the multipliers coupled to the inputs and configured to perform calculations associated with an inverse Fourier transform operation, where the first number is less than a number of inverse Fourier transform results corresponding to the inverse Fourier transform operation, at 404. For example, when the number of inverse Fourier transform results is equal to N and the first number of inputs is equal to q, where N and q are each integers, q may be less than N. The multipliers may include or correspond to the representative multiplier 236 of FIG. 2. The multipliers may be configured in rows of multipliers, such as the rows of multipliers 206, 208, 210, 212. Each input may be associated with a corresponding row of multipliers.

The multipliers may be coupled to a second number of outputs of the inverse Fourier transform circuit. For example, the outputs may include or correspond to the outputs 204. The outputs may be configured to output inverse Fourier transform results and may be considered to be partially parallel. Each multiplier may be coupled to a corresponding trace computation unit, such as the representative trace computation unit 230 of FIG. 2. For example, a trace computation unit may be coupled between an output of one of the multipliers and a corresponding adder. Each adder, such as the representative adder 232 of FIG. 2, may be configured to provide an output value.

The method 400 may enable an inverse Fourier transform to be performed over a finite field. For example, the inverse Fourier transform circuit may receive and process elements (e.g., a subset of an input vector) and may output inverse Fourier transform results according to the method 400. By processing the elements according to the method 400, the inverse Fourier transform circuit may have an architecture including simplified multipliers and/or computational units as compared to inverse Fourier transform circuits that have traditional partial parallel designs.

Figure 5:
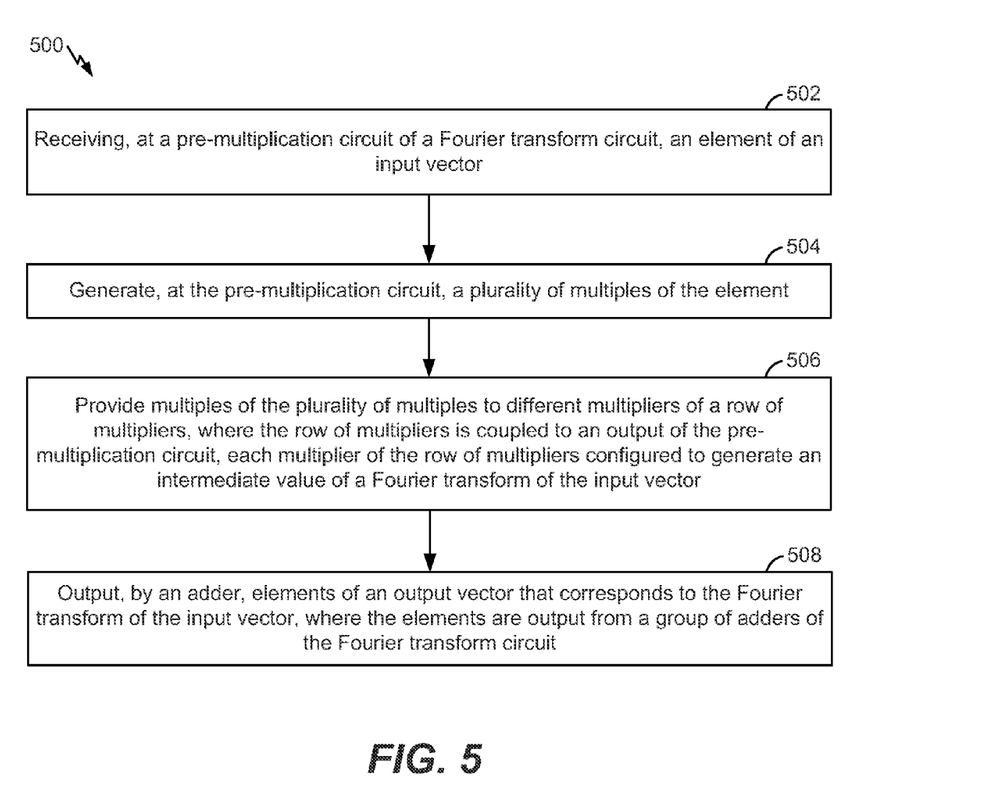
FIG. 5 is a flow diagram of a first illustrative method of performing a Fourier transform.

Referring to FIG. 5, a first illustrative embodiment of a method 500 of performing a Fourier transform is shown. For example, the method 500 may be performed by a Fourier transform circuit, such as the finite field Fourier transform circuit 124 of FIG. 1. For example, the Fourier transform circuit may be included in an encoder and/or a decoder, such as the encoder/decoder 122 of the data storage device 102 of FIG. 1. The Fourier transform circuit may be configured to receive inputs that are subfield elements of a finite field and to generate outputs that satisfy conjugacy constraints.

The method 500 includes receiving, at a pre-multiplication circuit of the Fourier transform circuit, an element of an input vector, at 502. For example, the pre-multiplication circuit may be included in or correspond to one of the pre-multiplication circuits 320, such as the representative pre-multiplication circuit 322 or the pre-multiplication circuit 350 of FIG. 3. The element may be received by the pre-multiplication circuit via an input, such as one of the inputs 302 of FIG. 3, configured to sequentially receive multiple elements of the input vector.

The method 500 further includes generating, at the pre-multiplication circuit, a plurality of multiples of the element, at 504. The pre-multiplication circuit may include a multiplier configured to generate at least one of the plurality of multiples. For example, for each element received by the pre-multiplication circuit, the pre-multiplication circuit may be configured to generate a corresponding plurality of multiples of the received element.

The method 500 also includes providing multiples of the plurality of multiples to different multipliers of a row of multipliers. The row of multipliers is coupled to an output of the pre-multiplication circuit and each multiplier of the row of multipliers is configured to generate an intermediate value of a Fourier transform of the input vector, at 506. For example, the row of multipliers may include or correspond to one of the rows of multipliers 306, 308, 310 of FIG. 3. The output of the pre-multiplication circuit may be provided via a multi-line bus, such as the multi-line bus 340 of FIG. 3.

The method 500 also includes outputting, by an adder, elements of an output vector that corresponds to the Fourier transform of the input vector, where the elements are output from a group of adders of the Fourier transform circuit, at 508. The group of adders may include or correspond to the adder circuits 314 of FIG. 3. At least one of the adders of the group of adders may be coupled to one of the pre-multiplication circuits and to one of the multipliers included in of the row of multipliers, such as the representative adder circuit 344 which is coupled to the representative multiplier 342 and to pre-multiplication circuitry that receives an input value $w_i$. Additionally, an output of each adder of the group of adders may be provided as a feedback value to the adder. The elements output by the group of adders may be associated with cyclotomic cosets formed by finite field elements. For example, each of the elements output by the group of adders may correspond to a different cyclotomic coset.

The complexity of method 500 for a Fourier transform may be reduced by carrying out the computations over a subfield of a finite field. For example, the Fourier transform computation architecture may take in a first group of values of $w_1, w_2, \ldots,$ and $w_0$ in a first clock cycle as illustrated in FIG. 3, and may then processes a second group of values of $w_{i+1}, w_{i+2}, w_{2l-i}, \ldots,$ and $w_l$ in a second clock cycle as illustrated in FIG. 3. The Fourier transform circuit may receive and process one or more elements of an input vector and may output a subset of Fourier transform results according to the method 500. By processing the elements according to the method 500, the Fourier transform circuit may have an architecture including simplified multipliers and/or computational units as compared to Fourier transform circuits that have traditional partial parallel designs.

Figure 6:
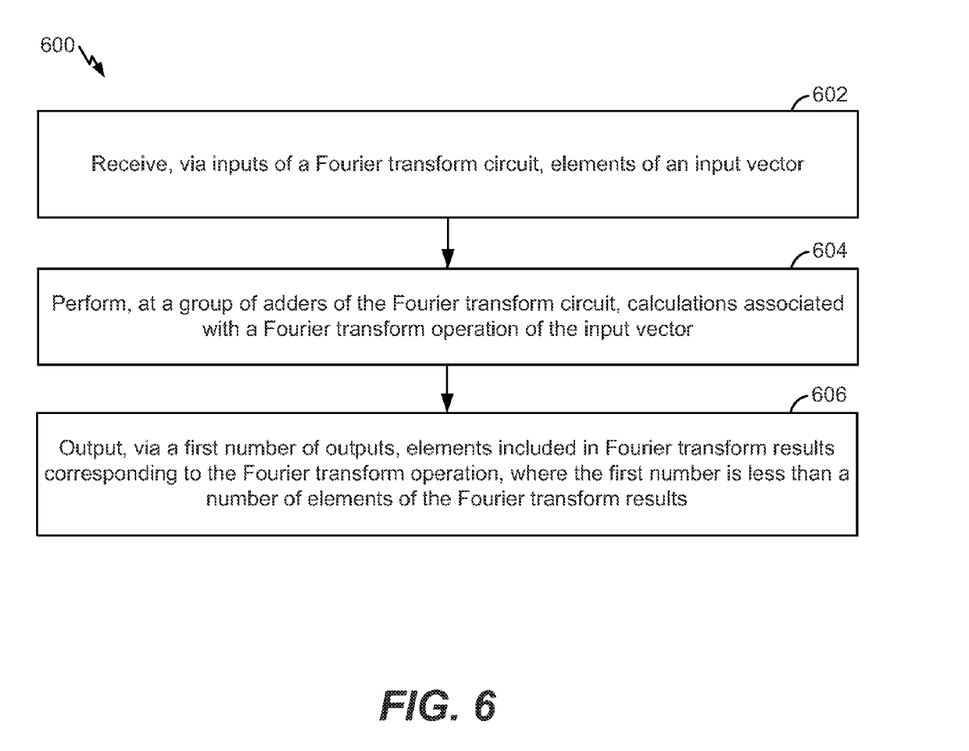
FIG. 6 is a flow diagram of a second illustrative method of performing a Fourier transform.

Referring to FIG. 6, a second illustrative embodiment of a method 600 of performing a Fourier transform is shown. For example, the method 600 may be performed by a Fourier transform circuit, such as the finite field Fourier transform circuit 124 of FIG. 1. For example, the Fourier transform circuit may be included in an encoder and/or a decoder, such as the encoder/decoder 122 of the data storage device 102 of FIG. 1. The Fourier transform circuit may be configured to receive inputs that are subfield elements of a finite field and to generate outputs that satisfy conjugacy constraints.

The method 600 includes receiving, via inputs of the Fourier transform circuit, elements of an input vector, at 602. For example, the inputs may include or correspond to the inputs 302 of FIG. 3, configured to sequentially receive multiple elements of the input vector.

The method 600 further includes performing, at a group of adders of the Fourier transform circuit, calculations associated with a Fourier transform operation of the input vector, at 604. The group of adders may include or correspond to the adder circuits 314 of FIG. 3. An output of each adder of the group of adders may be provided as a feedback value to the adder.

The method 600 also includes outputting, via a first number of outputs, elements included in Fourier transform results corresponding to the Fourier transform operation, where the first number is less than a number of elements of the Fourier transform results, at 606. The elements output via the first number of outputs may be associated with cyclotomic cosets formed by finite field elements. For example, each of the elements output via the first number of outputs may correspond to a different cyclotomic coset.

In some implementations, a second number of the inputs may be less than the number of elements of the Fourier transform results. The elements received via the inputs may be provided to a group of pre-multiplication circuits, such as the pre-multiplication circuits 320 (e.g., the representative pre-multiplication circuit 322 or the pre-multiplication circuit 350) of FIG. 3. Each of the pre-multiplications circuits may generate a plurality of multiples of elements received by the pre-multiplication circuit. The multiples generated by a particular pre-multiplication circuit may be provided to a corresponding row of multipliers, such as one of the rows of multipliers 306, 308, 310 of FIG. 3. Each multiplier of a particular row of multipliers may be coupled to a corresponding adder of the group of adders.

The method 600 for the Fourier transform operation may be performed over a subfield of a finite field. For example, the Fourier transform computation architecture may take in a first group of values of $w_1, w_2, \ldots,$ and $w_0$ in a first clock cycle as illustrated in FIG. 3, and may then processes a second group of values of $w_{i+1}, w_{i+2}, w_{2l-1}, \ldots,$ and $w_l$ in a second clock cycle as illustrated in FIG. 3. The Fourier transform circuit may receive and process one or more elements of an input vector and may output a subset of Fourier transform results according to the method 600. Other values of the Fourier transform results may be derived based on the elements output via the first number of outputs. By processing the elements according to the method 600, the Fourier transform circuit may have an architecture including simplified multipliers and/or computational units as compared to Fourier transform circuits that have traditional partial parallel designs.

One or more operations or functions, as described herein in relation to FIGS. 1-6, may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, one or more operations or functions, as described herein in relation to FIGS. 1-6, can be initiated or controlled by one or more processors included in or coupled to the data storage device 102 of FIG. 1, such as one or more processors included in or coupled to the controller 120 (e.g., the encoder/decoder 122, such as the FT circuit 124 and/or the IFT circuit 126) of FIG. 1, or one or more processors (or controllers) included in the host device 130 of FIG. 1.

A controller configured to perform one or more operations or functions, as described herein in relation to FIGS. 1-6, may be able to perform finite field Fourier transforms and inverse finite field Fourier transforms. Although various components of the data storage device 102 depicted herein are illustrated as block components and described in general terms, such components may include one or more microprocessors, state machines, or other circuits configured to enable the controller 120, the encoder/decoder 122, the FT circuit 124, and/or the IFT circuit 126 of FIG. 1 to perform operations described herein. One or more aspects of the controller 120, the encoder/decoder 122, the FT circuit 124, and/or the IFT circuit 126 may be implemented using a microprocessor or microcontroller programmed to perform operations described herein, such as one or more operations or functions, as described herein in relation to FIGS. 1-6. In a particular embodiment, the controller 120, the encoder/decoder 122, the FT circuit 124, and/or the IFT circuit 126 includes a processor executing instructions that are stored at the memory 104. Alternatively or additionally, executable instructions that are executed by the processor may be stored at a separate memory location that is not part of the memory 104, such as at a read-only memory (ROM). One or more operations described herein as being performed by the controller 120 (e.g., the encoder/decoder 122) may be performed at the memory 104 (e.g., "in-memory" decoding and/or "in-memory" encoding, as illustrative examples) alternatively or in addition to performing such operations at the controller 120 (e.g., the encoder/decoder 122).

The controller 120, the encoder/decoder 122, the FT circuit 124, and/or the IFT circuit 126 of FIG. 1 may be implemented using a microprocessor or microcontroller programmed to perform one or more operations or functions, as described herein in relation to FIGS. 1-6. For example, the microprocessor or microcontroller may be configured to execute instructions (e.g., a series of instructions, such as an algorithm) to perform certain operations described herein. In a particular embodiment, the controller 120, the encoder/decoder 122, the FT circuit 124, and/or the IFT circuit 126 (e.g., the microprocessor or microcontroller) includes a processor executing instructions that are stored at the memory 104. Alternatively, executable instructions that are executed by the processor may be stored at a separate memory location that is not part of the memory 104, such as at a read-only memory (ROM).

In an illustrative example, the processor may execute the instructions to execute an inverse finite field Fourier transform. For example, the processor may execute the inverse finite field Fourier transform using an inverse finite field Fourier transform circuit, such as the IFT circuit 126 of FIG. 1. The instructions to execute the inverse finite field Fourier transform may include instructions receive an input vector, instructions to identify a first number of elements of the input vector, instructions to provide the first number of elements to the inverse finite field Fourier transform circuit, instructions to send a first multiplexor control signal (e.g., an input selection signal associated with the first number of elements) to the inverse finite field Fourier transform circuit during a first iteration of the inverse finite field Fourier transform circuit, instructions to send a second multiplexor control signal (e.g., a feedback input selection signal associated with a first number of feedback values) to the inverse finite field Fourier transform circuit during a second iteration of the inverse finite field Fourier transform circuit, instructions to receive multiple sets of outputs from the inverse finite field Fourier transform circuit, and/or instructions to arrange the multiple sets of outputs as an inverse Fourier transform result, as illustrative, non-limiting examples.

In another illustrative example the processor may execute the instructions to execute a finite field Fourier transform. For example, the processor may execute the finite field Fourier transform using a finite field Fourier transform circuit, such as the FT circuit 124 of FIG. 1. The instructions to execute the finite field Fourier transform may include instructions receive an input vector, instructions to divide the input vector into one or more sub-vectors, instructions to provide each of the one or more sub-vectors to the finite field Fourier transform circuit, instructions to receive one or more output values of the finite field Fourier transform circuit, and/or instructions to generate an output vector of Fourier transform results based on the one or more output values, as illustrative, non-limiting examples.

In a particular embodiment, the data storage device 102 may be attached to or embedded within one or more host devices, such as within a housing of a host communication device, which may correspond to the host device 130. The data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices, such as the host device 130. For example, the data storage device 102 may be a removable device such as a Universal Serial Bus (USB) flash drive or a removable memory card, as illustrative examples.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification, as an illustrative example. Alternatively, the host device 130 may communicate with the data storage device 102 in accordance with another communication protocol.

The memory 104 may have a two-dimensional configuration, a three-dimensional (3D) configuration (e.g., a 3D memory), or any other configuration, and may include a single die or multiple dies (e.g., multiple stacked memory dies). The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 includes circuitry, such as the read circuitry 140 and/or the write circuitry of FIG. 1, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A circuit configured to perform an inverse Fourier transform operation based on an input vector and to generate a group of results corresponding to the inverse Fourier transform operation, the circuit comprising:
   a first number of inputs, each input configured to receive an element of the input vector and coupled to a multiplexer configured to iteratively produce intermediate values using a delay element in a feedback path that includes a multiplier, the feedback path between a multiplexer input of the multiplexer and a multiplexer output of the multiplexer;
   multipliers coupled to the multiplexer outputs and configured to perform multiple iterations of calculations associated with the inverse Fourier transform operation; and
   adders coupled to the multipliers and configured to iteratively output subgroups of the group of results corresponding to the inverse Fourier transform operation based on signals from the multipliers,
   wherein the first number is less than a number of inverse Fourier transform results in the group of results corresponding to the inverse Fourier transform operation.

2. The circuit of claim 1, wherein the adders are configured to output a subgroup and at least one additional subgroup, and wherein the subgroup and the at least one additional subgroup together produce an inverse Fourier transform result of the inverse Fourier transform operation.

3. The circuit of claim 1, wherein the number of inverse Fourier transform results is equal to N, wherein the first number of inputs is equal to q, wherein N and q are each integers, and wherein q is less than N.

4. The circuit of claim 1, wherein each multiplexer includes a first multiplexer input coupled to a corresponding one of the inputs and a second multiplexer input configured to receive a corresponding feedback value output by a corresponding delay element, and further comprising trace computation units coupled between the multipliers and the adders.

5. A method comprising:
   in a data storage device including a controller and a non-volatile memory, wherein the controller includes a circuit to perform an inverse Fourier transform operation based on an input vector to generate a group of results corresponding to the inverse Fourier transform operation, the circuit having a first number of input circuits, each input circuit configured to iteratively output scaled versions of an element of the input vector using a delay element in a feedback path of the input circuit, and multipliers coupled to the input circuits, performing:
   receiving, at the input circuits, elements of the input vector;
   providing the scaled versions to the multipliers, wherein the multipliers are configured to perform multiple iterations of calculations associated with the inverse Fourier transform operation; and
   outputting, via adders coupled to the multipliers and based on signals generated by the multipliers, subgroups of the group of results corresponding to the inverse Fourier transform operation,
   wherein the first number is less than a number of inverse Fourier transform results in the group of results corresponding to the inverse Fourier transform operation.

6. The method of claim 5, further comprising outputting a subgroup and at least one additional subgroup, the subgroup and the at least one additional subgroup outputted based on the multiple iterations to produce an inverse Fourier transform result of the inverse Fourier transform operation.

7. The method of claim 5, wherein each of the input circuits is associated with a corresponding row of the multipliers, and wherein the first number is less than a second number of elements included in the input vector.

8. The method of claim 5, wherein the first number of input circuits is associated with cyclotomic co sets of elements of a finite field, and wherein each of the input circuits corresponds to a different cyclotomic coset.

9. The method of claim 5, wherein the non-volatile memory includes a three-dimensional (3D) memory configuration that is monolithically formed in one or more physical levels of arrays of storage elements having an active area disposed above a silicon substrate, and wherein the data storage device includes circuitry associated with operation of the storage elements.

10. A data storage device comprising:
a non-volatile memory; and
a controller operatively coupled to the non-volatile memory, wherein the controller includes a circuit configured to perform an inverse Fourier transform operation based on an input vector and to generate a group of results corresponding to the inverse Fourier transform operation, the circuit comprising:
a first number of inputs, each input configured to receive an element of the input vector and coupled to a multiplexer configured to iteratively produce intermediate values using a delay element in a feedback path that includes a multiplier, the feedback path between an input of the multiplexer and an output of the multiplexer;
multipliers coupled to the outputs, each multiplier configured to perform calculations associated with the inverse Fourier transform operation;
adders coupled to the multipliers; and
trace computation units coupled between the multipliers and the adders,
wherein the first number is less than a number of inverse Fourier transform results in the group of results corresponding to the inverse Fourier transform operation.

11. The data storage device of claim 10, wherein the controller comprises a low density parity check (LDPC) encoder, and wherein the LDPC encoder includes the circuit.

12. The data storage device of claim 10, wherein the controller further includes a decoder that includes the circuit and a Fourier transform circuit, and wherein the decoder is configured to use the circuit or the Fourier transform circuit during a decoding operation performed on a value received from the non-volatile memory.

13. The data storage device of claim 10, wherein the non-volatile memory includes a three-dimensional (3D) memory configuration that is monolithically formed in one or more physical levels of arrays of storage elements having an active area disposed above a silicon substrate, and wherein the data storage device includes circuitry associated with operation of the storage elements.

14. A Fourier transform circuit comprising:
multipliers;
a pre-multiplication circuit of a group of pre-multiplication circuits that have inputs configured to receive elements of an input vector, the pre-multiplication circuit configured to receive an element of the elements and to route, via a switching circuit, a plurality of multiples of the elements to the multipliers;
a group of adders coupled to the multipliers and configured to perform calculations associated with a Fourier transform operation of the input vector to output subgroups of a group of results corresponding to the Fourier transform operation; and
a first number of terminals configured to output each subgroup of the group of results corresponding to the Fourier transform operation,
wherein the first number is less than a number of Fourier transform results in the group of results corresponding to the Fourier transform operation.

15. The Fourier transform circuit of claim 14, wherein each of the inputs is configured to sequentially receive multiple elements of the input vector.

16. The Fourier transform circuit of claim 15, wherein each pre-multiplication circuit is configured to generate, for each received element of the multiple elements, a corresponding plurality of multiples of the received element.

17. The Fourier transform circuit of claim 14, wherein each pre-multiplication circuit includes at least one multiplier configured to generate the plurality of multiples.

18. The Fourier transform circuit of claim 14, further comprising multiple rows of the multipliers, each row of multipliers coupled to an output of a respective pre-multiplication circuit and configured to generate intermediate values of the Fourier transform operation.

19. The Fourier transform circuit of claim 18, wherein at least one adder of the group of adders is coupled to one of the pre-multiplication circuits of the group of pre-multiplication circuits and to a multiplier included in each row of the multiple rows of the multipliers.

20. The Fourier transform circuit of claim 14, wherein each adder of the group of adders is coupled to a different terminal of the first number of terminals.

21. The Fourier transform circuit of claim 14, wherein each adder of the group of adders is configured to generate an output element included in the Fourier transform results of the Fourier transform operation.

22. A method comprising:
in a data storage device including a controller and a non-volatile memory, wherein the controller includes a Fourier transform circuit having inputs, multipliers, adders, and a first number of terminals, performing:
receiving, via the inputs, elements of an input vector;
performing, at the multipliers and of the adders, iterations of calculations associated with a Fourier transform operation of the input vector to generate subgroups of a group of results corresponding to the Fourier transform operation, wherein an output of each adder of the adders is provided as a feedback value to the adder; and
outputting, via the first number of terminals, each subgroup of the group of results corresponding to the Fourier transform operation,
wherein the first number is less than a number of Fourier transform results in the group of results corresponding to the Fourier transform operation.

23. The method of claim 22, wherein elements output via the first number of terminals are associated with cyclotomic cosets formed by finite field elements.

24. The method of claim 23, wherein each of the elements corresponds to a different cyclotomic coset.

25. The method of claim 22, wherein the non-volatile memory includes a three-dimensional (3D) memory configuration that is monolithically formed in one or more physical levels of arrays of storage elements having an active area disposed above a silicon substrate, and wherein the data storage device includes circuitry associated with operation of the storage elements.

26. A data storage device comprising:
- a non-volatile memory; and
- a controller operatively coupled to the non-volatile memory, wherein the controller includes a Fourier transform circuit, wherein the Fourier transform circuit comprises:
  - inputs configured to receive elements of an input vector;
  - multipliers and a group of adders configured to perform iterations of calculations associated with a Fourier transform operation of the input vector and to generate subgroups of a group of results corresponding to the Fourier transform operation; and
  - a first number of terminals configured to output each subgroup of results included in Fourier transform results corresponding to the Fourier transfoun operation,
  - wherein the first number is less than a number of results in the group of results corresponding to the Fourier transform operation.

27. The data storage device of claim 26, wherein the controller further comprises a low density parity check (LDPC) decoder, and wherein the LDPC decoder includes the Fourier transform circuit.

28. The data storage device of claim 26, wherein the controller further includes an encoder.

29. The data storage device of claim 28, wherein the encoder includes the Fourier transform circuit and an inverse Fourier transform circuit, and wherein the encoder is configured to use the inverse Fourier transform circuit or the Fourier transform circuit during an encoding operation performed on data to generate a codeword to be stored in the non-volatile memory.

30. A circuit configured to perform an inverse Fourier transform operation based on an input vector and to generate a group of results corresponding to the inverse Fourier transform operation, the circuit comprising:
- means for inputting an input vector, the means for inputting comprising a first number of means for receiving elements, wherein each means for receiving is configured to receive an element of the input vector and coupled to a means for selecting signals configured to iteratively produce intermediate values using a means for delaying signals in a feedback path that includes a multiplier, the feedback path between an input of the means for selecting and an output of the means for selecting;
- means for multiplying coupled to the outputs of the means for selecting and configured to perform multiple iterations of calculations associated with the inverse Fourier transform operation; and
- means for outputting, via means for adding coupled to the means for multiplying, subgroups of the group of results corresponding to the inverse Fourier transform operation based on signals from the means for multiplying,
- wherein the first number is less than a number of inverse Fourier transform results in the group of results corresponding to the inverse Fourier transform operation.

31. The circuit of claim 30, wherein the means for inputting, the means for multiplying, and the means for outputting are included in a data storage device.

* * * * *